(12) United States Patent
Nakamoto

(10) Patent No.: US 8,249,465 B2
(45) Date of Patent: Aug. 21, 2012

(54) LIGHT TRANSMITTING APPARATUS AND METHOD FOR CONTROLLING THE SAME

(75) Inventor: Kenichi Nakamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 389 days.

(21) Appl. No.: 12/585,041

(22) Filed: Sep. 1, 2009

(65) Prior Publication Data

US 2009/0324255 A1    Dec. 31, 2009

Related U.S. Application Data

(63) Continuation of application No. PCT/JP2007/057174, filed on Mar. 30, 2007.

(51) Int. Cl.
*H04B 10/04* (2006.01)
(52) U.S. Cl. ............... 398/198; 398/197; 398/201
(58) Field of Classification Search ........... 398/183, 398/186, 196–197, 201, 198
See application file for complete search history.

(56) References Cited

U.S. PATENT DOCUMENTS

| 5,550,855 | A | 8/1996 | Aoyagi et al. |
| 6,516,017 | B1 | 2/2003 | Matsumoto |
| 6,583,910 | B1 | 6/2003 | Satoh |
| 2004/0008995 | A1 | 1/2004 | Ono et al. |
| 2007/0081565 | A1* | 4/2007 | Sasada et al. ............ 372/28 |

FOREIGN PATENT DOCUMENTS

| JP | 03-286587 | 12/1991 |
| JP | 07-231141 | 8/1995 |
| JP | 09-146055 | 6/1997 |
| JP | 2616206 | 6/1997 |
| JP | 2891741 | 5/1999 |
| JP | 2000-292756 | 10/2000 |
| JP | 2001-144367 | 5/2001 |
| JP | 2001-333020 | 11/2001 |
| JP | 3333133 | 7/2002 |
| JP | 2002-299751 | 10/2002 |
| JP | 2003-163639 | 6/2003 |
| JP | 3453406 | 7/2003 |
| JP | 2004-47589 | 2/2004 |
| JP | 2005-236209 | 9/2005 |

(Continued)

OTHER PUBLICATIONS

International Preliminary Report on Patentability mailed Oct. 29, 2009 in corresponding to International application No. PCT/JP2007/057174.

(Continued)

*Primary Examiner* — Leslie Pascal
(74) *Attorney, Agent, or Firm* — Staas & Halsey LLP

(57) ABSTRACT

A light transmitting apparatus of the invention includes: a light transmitting section having a light source and an EA modulator, and a control section that controls the optical output power of the light transmitting section to be constant, based on a monitor value of EA photoelectric current. The control section uses a reference value corresponding to a wavelength of the light source, from amongst reference values of the EA photoelectric current that are different for each wavelength, and feedback controls the light transmitting section depending on a difference between the reference value and the monitor value. As a result it is possible to reliably suppress fluctuations in the optical output power due to changes in the wavelength of the light source.

19 Claims, 8 Drawing Sheets

FOREIGN PATENT DOCUMENTS

| | | |
|---|---|---|
| JP | 2006-054929 | 2/2006 |
| JP | 2006-086431 | 3/2006 |

OTHER PUBLICATIONS

Patent Abstracts of Japan, Publication No. 2006-054929, Published Feb. 23, 2006.
Patent Abstracts of Japan, Publication No. 2002-299751, Published Oct. 11, 2002.
Patent Abstract of Japan, Publication No. 03-286587, Published Dec. 17, 1991.
Patent Abstracts of Japan, Publication No. 04-162481, Published Jun. 5, 1992.
Patent Abstracts of Japan, Publication No. 2000-292756, Published Oct. 20, 2000.
Patent Abstracts of Japan, Publication No. 2001-333020, Published Nov. 30, 2001.
Patent Abstracts of Japan, Publication No. 09-146055, Published Jun. 6, 1997.
Patent Abstracts of Japan, Publication No. 2005-236209, Published Sep. 2, 2005.
Patent Abstracts of Japan, Publication No. 07-231141, Published Aug. 29, 1995.
Patent Abstracts of Japan, Publication No. 2006-086431, Published Mar. 30, 2006.
Patent Abstracts of Japan, Publication No. 2003-163639, Published Jun. 6, 2003.
Japanese Language International Search Report mailed May 15, 2007 in corresponding PCT Application No. PCT/JP2007/057174.

* cited by examiner

| WAVELENGTH | REFERENCE VALUE OF EA PHOTOELECTRIC CURRENT |
|---|---|
| $\lambda 1$ | $Ir1$ |
| ⋮ | ⋮ |
| $\lambda n$ | $Irn$ |

RELATION BETWEEN EXTINCTION RATIO
AND EA BIAS WHEN WAVELENGTH CHANGES

RELATION BETWEEN PHOTOELECTRIC CURRENT
AND EA BIAS WHEN WAVELENGTH CHANGES

RELATION BETWEEN PHOTOELECTRIC CURRENT AND
EA OPTICAL OUTPUT POWER WHEN WAVELENGTH CHANGES

RELATION BETWEEN EXTINCTION RATIO
AND EA BIAS WHEN TEMPERATURE CHANGES

RELATION BETWEEN PHOTOELECTRIC CURRENT
AND EA BIAS WHEN TEMPERATURE CHANGES

RELATION BETWEEN PHOTOELECTRIC CURRENT AND
EA OPTICAL OUTPUT POWER WHEN TEMPERATURE CHANGES

LIGHT TRANSMITTING APPARATUS AND METHOD FOR CONTROLLING THE SAME

CROSS-REFERENCE TO RELATED APPLICATION

This application is a continuation of PCT/JP2007/057174, filed on Mar. 30, 2007, the entire contents of which are incorporated herein by reference.

FIELD

The embodiment discussed herein is related to a light transmitting apparatus to be used in optical communication, and a control method thereof. In particular the embodiment is related to a technique for controlling the optical output power of a light transmitting apparatus suitable for a wavelength division multiplexing (WDM) system.

BACKGROUND

Long-distance, high-speed, and large-capacity optical communication becomes essential with the recent increase in data traffic, and construction of a WDM network is progressing. In the WDM network, a plurality of light transmitting apparatuses corresponding to different wavelengths is required, and inventory and type control of the light transmitting apparatuses becomes complicated. A light transmitting apparatus that uses a wavelength-tunable light source, a semiconductor laser (LD) array light source, or the like is a key device effective for inventory and type reduction. In particular, a light transmitting apparatus integrated with a light source and an electro-absorption optical modulator (hereinafter, referred to as EA modulator) disclosed in Patent Document 1 below is effective for miniaturization, and is promising for use as a small size TOSA (Transmitter Optical Sub Assembly) that is mounted on a pluggable module that complies with the standard of XFP (10 Gbit/s small Form-factor pluggable). Pluggable means that the optical module can be taken out and inserted as is in an energized state, with respect to a slot of an optical transmitter.

In an optical communication system that uses the above-described light transmitting apparatus, an average optical output power of the light transmitting apparatus needs to be made constant from a viewpoint of stability of the system. However, in the light transmitting apparatus for a small size TOSA, it is difficult to mount an optical detector (hereinafter, referred to as a monitor PD) for monitoring the optical output power, due to mounting space. Therefore, as an alternative means for the monitor PD, for example in Patent Documents 2 and 3 below, a monitoring method of the optical output power that uses photoelectric current (hereinafter, referred to as EA photoelectric current) generated due to optical absorption by the EA modulator has been proposed. Specifically, in an light transmitting apparatus integrating a light source and the EA modulator, a mean value of the EA photoelectric current is monitored, and a drive current of the light source or a bias voltage of the EA modulator (hereinafter, referred to as EA bias) is controlled so that the monitored value becomes constant at a preset reference value, to thereby control the optical output power to be constant.

Moreover, as a conventional art relating to general control of the light transmitting apparatus integrating the light source and the EA modulator, for example, techniques described in Patent Documents 4 to 7 below are known. Specifically, Patent Document 4 represents where, for a light transmitting apparatus having an LD array light source and an EA modulator, temperature control and EA bias control are performed so that a difference between oscillation wavelength of the light source and bandgap wavelength of the EA modulator becomes constant. Patent Document 5, represents a technique where, for a light transmitting apparatus having an wavelength-tunable light source and an EA modulator, in addition to automatic power control (APC) by back power monitoring of the light source, in order to stabilize the optical output power by eliminating fluctuations in the optical output power due to a temperature change when the wavelength is tunable, an output of an EA modulator is branched and monitored to feed-back control the EA bias according to a result thereof. Patent Document 6 represents where, for a light transmitting apparatus integrating a wavelength-tunable light source and an EA modulator, a drive current of a light source is changed according to a modulation signal, and a chirp is counterbalanced by providing a chirp opposite to the chirp generated in the EA modulator, to the light source, to thereby realize long-distance transmission. Patent Document 7 represents where, for a light transmitting apparatus having a light source and an EA modulator, a drive condition of the EA modulator is adjusted so that variations in the optical frequency of the optical output become an optimum.

Patent Document 1: Japanese Patent No. 2891741
Patent Document 2: Japanese Patent No. 2616206
Patent Document 3: Japanese Laid-open Patent Publication No. 2000-292756
Patent Document 4: Japanese Laid-open Patent Publication No. 2001-144367
Patent Document 5: Japanese Laid-open Patent Publication No. 2001-333020
Patent Document 6: Japanese Patent No. 3453406
Patent Document 7: Japanese Patent No. 3333133

Incidentally in a conventional light transmitting apparatus having the above-described wavelength-tunable light source, or LD array light source and EA modulator, when the monitoring method of the optical output power using the EA photoelectric current is applied, the EA photoelectric current also varies depending on wavelength as illustrated in FIG. 11, for example, due to wavelength dependency of extinction characteristics of the EA modulator as illustrated in FIG. 10. In the figure, $\lambda 1$, $\lambda 2$, and $\lambda 3$ respectively denote a wavelength of light input to the EA modulator, where $\lambda 1 < \lambda 2 < \lambda 3$. Therefore, when the drive current of the light source is controlled by using a reference value of the EA photoelectric current common to all the wavelengths as in the conventional art, the optical output power of the light source (optical input power of the EA modulator) varies depending on the wavelength, and as a result, the optical output power of the EA modulator varies as illustrated in FIG. 12. Fluctuations in the optical output power increase as a wavelength-tunable range of the light input to the EA modulator becomes wide, so that there is a problem in that these can no longer be accepted as optical output power fluctuations of the light transmitting apparatus.

Moreover, the above optical output power fluctuations at the time of applying feed-back control based on monitoring of the EA photoelectric current, occur not only due to the wavelength dependency of the EA photoelectric current but also, for example, due to temperature dependency of the EA photoelectric current. That is to say, due to the temperature dependency of the extinction characteristics of the EA modulator as illustrated in FIG. 13, the EA photoelectric current also fluctuates depending on the temperature (T1<T2<T3), as illustrated in FIG. 14. Therefore, if the drive current of the light source is controlled by using the reference value of the EA photoelectric current common to all temperatures, the optical output power of the light source fluctuates depending on the temperature, and as a result, as illustrated in FIG. 15, the optical output power of the EA modulator fluctuates, thereby causing the same problem as for the case of the aforementioned wavelength dependency.

By combining the above-described conventional art, and monitoring the EA photoelectric current, and controlling the EA bias so that the monitor value becomes constant, the optical output power fluctuations of the light transmitting apparatus can be suppressed. However, as described in Patent Documents 4, 6, and 7, the EA bias is a parameter for controlling the chirp, and the EA bias needs to be controlled so that an appropriate chirp characteristic can be obtained, in order to realize long-distance transmission. For example, in long-distance transmission exceeding 80 km, if the EA bias is controlled to suppress the optical output power fluctuations, transmission degradation may be caused due to a change of the chirp characteristic.

SUMMARY

One aspect of a light transmitting apparatus according to the invention includes; a light transmitting section having a light source and an electro-absorption optical modulator that modulates light output from the light source, and a control section that controls the light transmitting section so that an optical output power from the light transmitting section becomes constant, based on a monitor value of photoelectric current generated due to light absorption by the electro-absorption optical modulator. The control section is configured to use a reference value of the photoelectric current corresponding to a wavelength of the light source, from amongst reference values of the photoelectric current that are different for each wavelength and are set depending on the wavelength dependency of the photoelectric current of the electro-absorption optical modulator, to control the light transmitting section depending on a difference between the reference value and the monitor value.

In the light transmitting apparatus having such a configuration, when the optical output power is controlled to be constant based on the monitor value of the EA photoelectric current, the reference values of the photoelectric current that are different for each wavelength are set depending on the wavelength dependency of the EA photoelectric current, a reference value corresponding to the wavelength of the light source is selected from amongst the reference values of the photoelectric current, and the optical output power of the light transmitting section is feed-back controlled depending on a difference between the reference value and the monitor value.

Moreover, one aspect of a method for controlling a light transmitting apparatus according to the invention is a method for controlling a light transmitting apparatus that provides light output from a light source to an electro-absorption optical modulator to modulate the light, that involves monitoring photoelectric current generated due to light absorption by the electro-absorption optical modulator, and controlling the light transmitting apparatus based on a monitor value of the photoelectric current so that an optical output power of the light transmitting apparatus becomes constant. The method includes: setting reference values of the photoelectric current that are different for each wavelength depending on wavelength dependency of the photoelectric current of the electro-absorption optical modulator, and using a reference value of the photoelectric current corresponding to the wavelength of the light source, from amongst the set reference values of the photoelectric current that are different for each wavelength, to control the light transmitting apparatus depending on a difference between the reference value and the monitor value.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereunder is a description of a configuration for executing the invention, with reference to the accompanying drawings. The same reference symbols denote the same or equivalent parts throughout all of the drawings.

Figure 1:
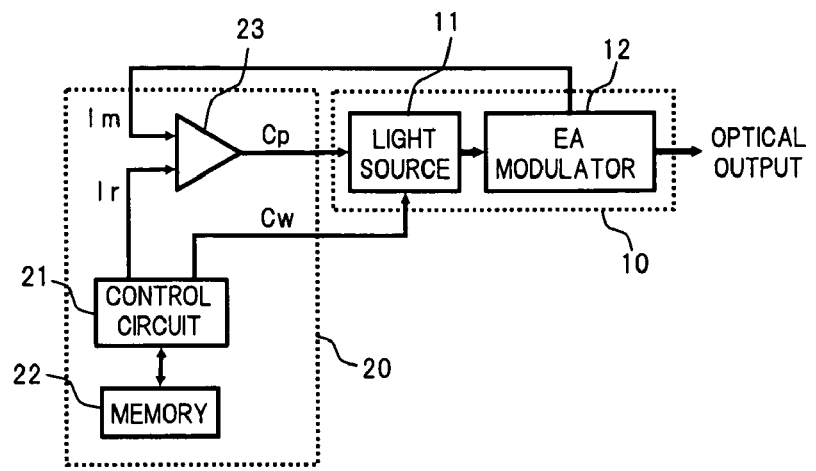
FIG. 1 is a block diagram illustrating a configuration of a light transmitting apparatus according to a first embodiment of the present invention.

FIG. 1 is a block diagram illustrating a configuration of a light transmitting apparatus according to a first embodiment of the invention.

In FIG. 1, the light transmitting apparatus includes, for example, a light transmitting section 10 that has a light source 11 and an EA modulator 12, and a control section 20 that controls the light transmitting section 10 so that an optical output power of the light transmitting section 10 becomes constant based on a monitor value Im of photoelectric current generated by optical absorption by the EA modulator 12, using a reference value Ir of the photoelectric current that is set to a different value for each wavelength.

The light source 11 is a wavelength-tunable light source that is capable of changing, for example, the wavelength and the optical output power. As a specific example of the light source 11, as illustrated on the left side in FIG. 2, a well-known wavelength-tunable light source (for example, refer to Japanese Laid-open Patent Publication No. 2006-295102 or 2006-295103) can be used, which has an optical waveguide 11A in which a wavelength control layer $11A_1$ and a gain control layer $11A_2$ are arranged alternately in an optical axis direction, and can respectively control an oscillation wavelength and a gain by independently controlling a drive current Itune provided to an electrode $11B_1$ corresponding to the wavelength control layer $11A_1$ and a drive current Iact provided to an electrode $11B_2$ corresponding to the gain control layer $11A_2$. Reference symbol 11C in FIG. 2 denotes a diffraction grating formed along the optical waveguide 11A, and reference symbol 11D denotes an earth electrode. However, the configuration of the light source used for the present invention is not limited to the above specific example.

Figure 2:
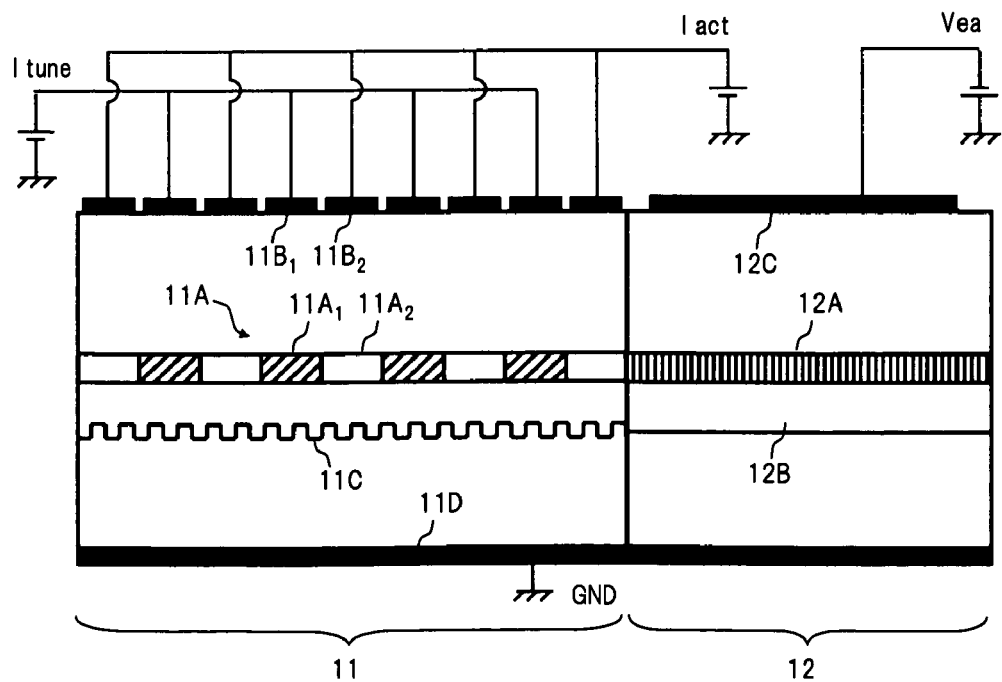
FIG. 2 is a sectional view illustrating a specific configuration example of a light source and an EA modulator in the first embodiment.

The EA modulator 12 is integrated in the same chip as the light source 11, for example, as illustrated on the right side in FIG. 2. By providing the light from the light source 11 to an absorption layer 12A surrounded by a guide layer 12B, and applying a bias voltage (EA bias) Vea that changes in level according to transmission data to the electrode 12C, the light propagating in the absorption layer 12A is intensity modulated and output. Moreover the photoelectric current generated due to optical absorption by the EA modulator is monitored, and a monitor value Im is output to the control section 20 (refer to FIG. 1).

Figures 3, 4:
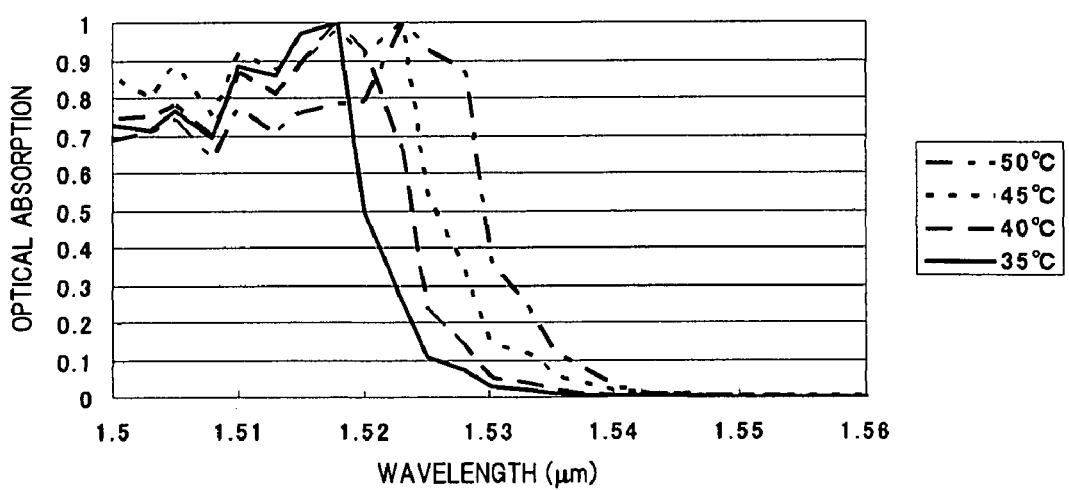
FIG. 3 illustrates one example of storage information of a memory, in the first embodiment.
FIG. 4 illustrates one example of a relation between light absorption amount of the EA modulator and wavelength.

The control section 20 has, for example, a control circuit 21, a memory 22, and a comparison circuit 23. The control circuit 21 generates a control signal Cw that controls the wavelength of the light source 11, and reads out a reference value Ir of the EA photoelectric current corresponding to the wavelength, from the memory 22, and outputs this to the comparison circuit 23. For example, as illustrated in FIG. 3, reference values Ir1 to Irn of the EA photoelectric current corresponding to respective wavelengths λ1 to λn within a wavelength-tunable range of the light source 11 are stored beforehand in the memory 22. Details of the storage information in the memory 22 will be described later. The comparison circuit 23 compares the monitor value Im of the photoelectric current from the EA modulator 12 with the reference value Ir from the control circuit 21, and generates a control signal Cp for controlling the optical output power (gain) of the light source 11 so as to reduce a difference therebetween.

Next is a description of an operation of the first embodiment.

In the light transmitting apparatus having the configuration described above, the drive current Itune of the light source 11 is controlled according to the wavelength control signal Cw output from the control circuit 21, and the drive current Iact of the light source 11 is controlled according to the power control signal Cp output from the comparison circuit 23. The drive current Itune and the drive current Iact are provided to the electrodes $11B_1$ and $11B_2$ to thereby drive the light source 11, and the output light from the light source 11 is provided to the EA modulator 12. In the EA modulator 12, the EA bias Vea corresponding to the transmission data is applied to the electrode 12C, to thereby modulate the intensity of the light from the light source 11 according to the transmission data. At this time, the photoelectric current generated due to optical absorption by the EA modulator 12 is monitored, and the monitor value Im is transmitted to the comparison circuit 23 in the control section 20. The reference value Ir of the EA photoelectric current has been provided from the control circuit 21 to the comparison circuit 23, and comparison between the monitor value Im of the EA photoelectric current and the reference value Ir is performed. The reference value Ir of the EA photoelectric current provided to the comparison circuit 23 at this time is obtained by reading out the reference value corresponding to the present oscillation wavelength of the light source 11 by the control circuit 21 from amongst the reference values Ir1 to Irn that are different for each wavelength, stored in the memory 22.

Here is a detailed description of the reference values Ir of the EA photoelectric current that are stored in the memory 22.

Figure 10:
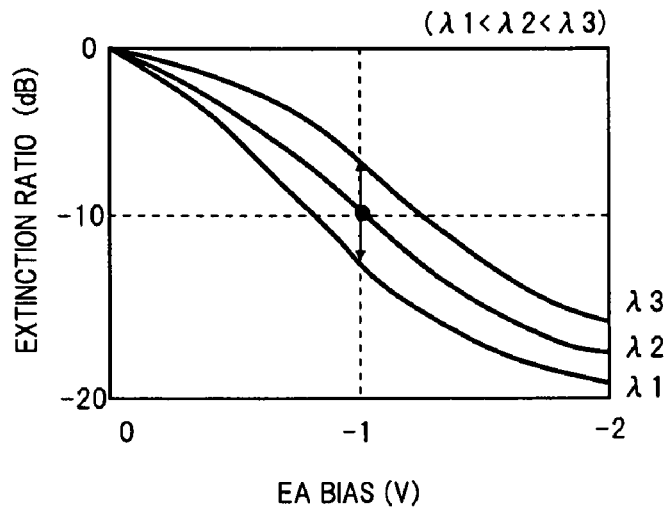
FIG. 10 illustrates wavelength dependency of a extinction characteristic of the EA modulator.
Figure 11:
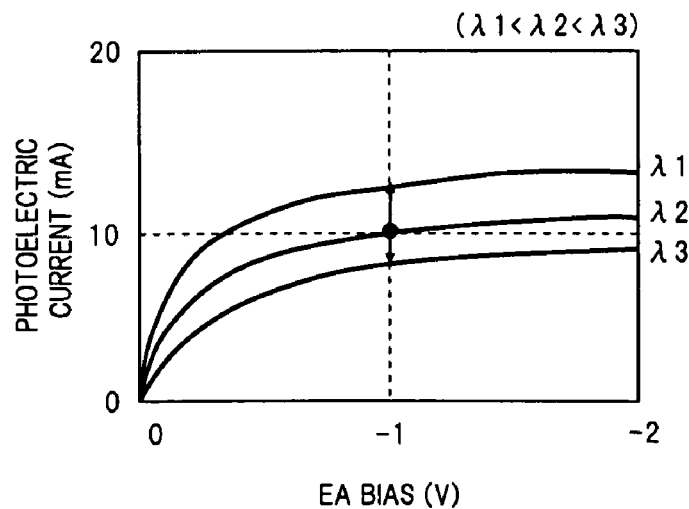
FIG. 11 illustrates wavelength dependency of the photoelectric current of the EA modulator.
Figure 12:
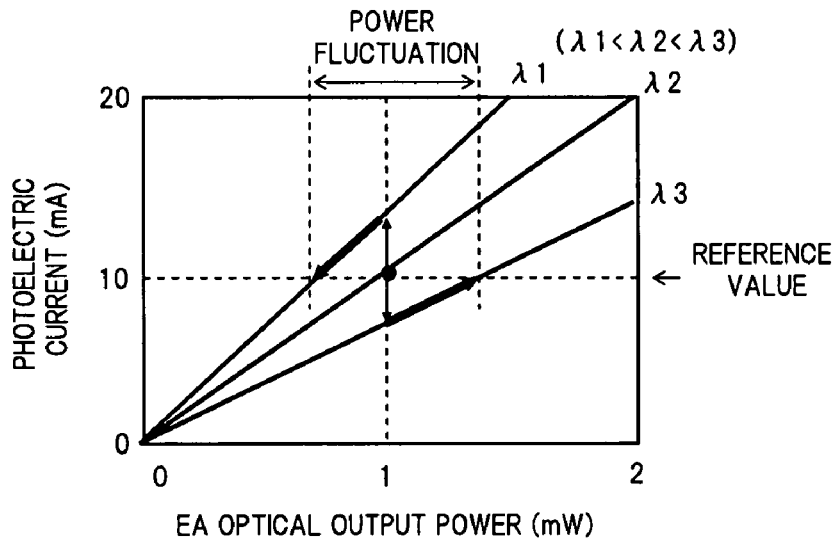
FIG. 12 illustrates optical output power fluctuations due to a wavelength change, in conventional control using EA photoelectric current.

As illustrated in the aforementioned FIG. 10 to FIG. 12, the EA photoelectric current has wavelength dependency. The EA photoelectric current changes in proportion to the optical absorption in the EA modulator. The relation between the optical absorption and the wavelength is different depending on the material used for the EA modulator, and individual differences for each EA modulator are large. FIG. 4 illustrates the relation between optical absorption of the EA modulator and wavelength. Here the optical absorption is a value that is standardized, designating an optical input to the EA modulator as 1, and optical absorption=1 corresponds to total absorption. In one example illustrated in FIG. 4, around 1.523 μm is an absorption edge wavelength. The absorption edge wavelength can be obtained from a relation between photon energy and bandgap. On the other hand, a relation between from the absorption edge wavelength to a wavelength in which the optical absorption becomes zero (about 1.54 μm), changes depending on the temperature of the EA modulator. Moreover, although not illustrated in the drawing, the individual differences for each EA modulator are large.

In the light transmitting apparatus in the embodiment, the relation between the optical absorption (or the photoelectric current) and the wavelength at a standard temperature is measured beforehand, for example, for the EA modulator 12 to be used, taking the characteristics of the EA modulator into consideration, to create a table of the reference values Ir1 to Irn of the EA photoelectric current corresponding to the respective wavelengths λ1 to λn based on the result thereof, and the table is stored in the memory 22 (refer to FIG. 3). As a result, the reference value of the EA photoelectric current corresponding to the oscillation wavelength of the light source 11 is read from the stored data in the memory 22 and used, thereby enabling to perform feedback control of the light source 11 based on the monitor value Im and the reference value Ir of the EA photoelectric current.

Here one example in which the reference values Ir1 to Irn of the EA photoelectric current corresponding to the respective wavelengths λ1 to λn are tabled and stored in the memory 22 is represented. However the invention is not limited thereto, and for example, the relation between the optical absorption and the wavelength as illustrated before in FIG. 4 can be linearly approximated, and the relation between the photoelectric current and the wavelength can be also linearly approximated, to determine a constant in an approximate equation by actually measuring the EA photoelectric current for two wavelengths corresponding to opposite ends of the wavelength-tunable range of the light source 11. Then, the reference values In1 to Irn of the EA photoelectric current corresponding to the respective wavelengths λ1 to λn can be obtained by calculation by using the approximate equation.

Figure 5:
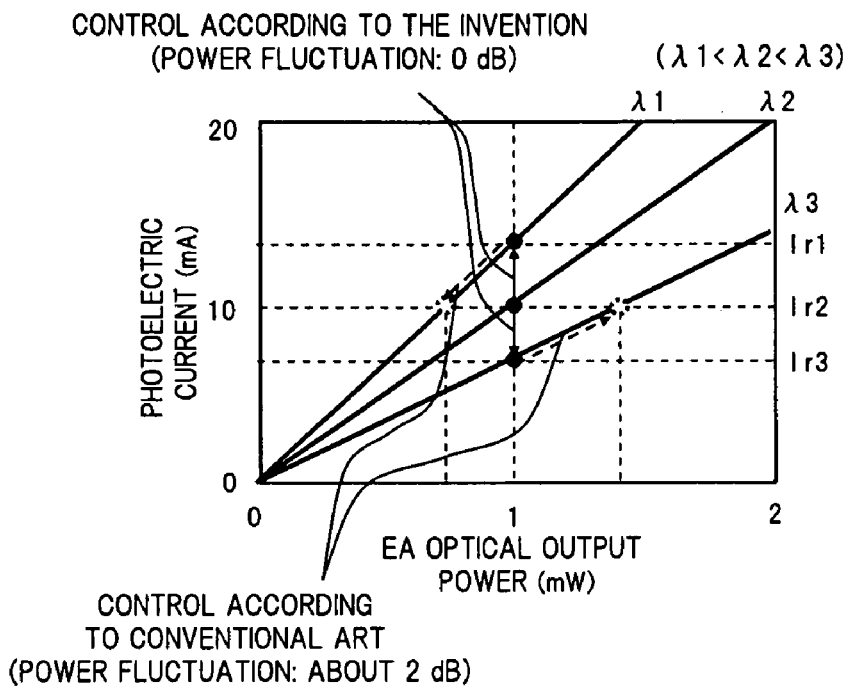
FIG. 5 illustrates a suppression effect of optical output power fluctuations in the first embodiment.

In the above manner, when the difference between the monitor value Im and the reference value Ir of the EA photoelectric current corresponding to the oscillation wavelength of the light source 11 is obtained in the comparison circuit 23, a power control signal Cp for decreasing the difference (preferably, to zero) is generated, and the power control signal Cp is output to the light source 11. As a result, the drive current Iact supplied to the light source 11 is adjusted in accordance with the power control signal Cp, so that as illustrated in FIG. 5, the power of the optical signal output from the EA modulator 12 is controlled to be constant at a desired level (for example, 1 mW), regardless of the wavelength.

In the above manner, according to the light transmitting apparatus in the first embodiment, feedback control of the light source 11 based on the monitor value Im of the EA photoelectric current is performed by using the reference value Ir corresponding to the oscillation wavelength of the light source 11, thereby enabling to reliably suppress fluctuations in the optical output power due to changes in the wavelength of the light source 11. Specifically, for example, when wavelength tuning (wavelength-tunable range: 2.4 nm) corresponding to four channels with an interval of 100 GHz is performed, optical output power fluctuations of about 2 dB occur in the conventional art as illustrated by the broken line arrows in FIG. 5. On the other hand, in the present light transmitting apparatus, the optical output power fluctuations can be made 0 dB ideally as illustrated by the solid line arrows in FIG. 5.

In the first embodiment, the configuration example using the wavelength-tunable light source has been described. However, the light source to be used in the invention is not limited to the example described above, and for example, an LD array light source in which a plurality of semiconductor lasers of different oscillation wavelengths is arrayed, can also be used. In this case, EA modulators are provided, respectively corresponding to each LD in the LD array light source, and the drive current of each LD can be feed-back controlled based on; the reference value of the EA photoelectric current corresponding to the oscillation wavelength of each LD, and the monitor value of the photoelectric current in the respective EA modulators.

Next is a description of a second embodiment of the invention.

Figure 6:
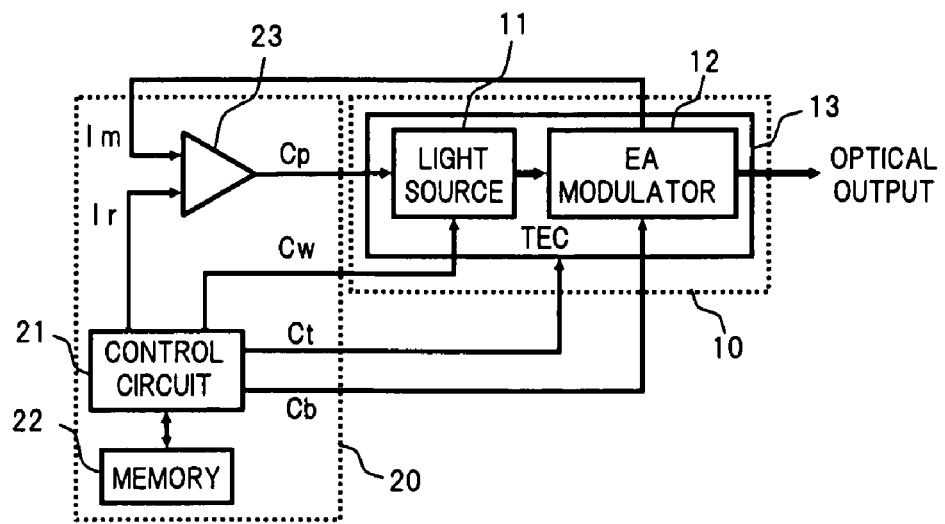
FIG. 6 is a block diagram illustrating a configuration of a light transmitting apparatus according to a second embodiment of the present invention.

FIG. 6 is a block diagram illustrating a configuration of a light transmitting apparatus according to the second embodiment of the invention.

In FIG. 6, for example with respect to the configuration of the first embodiment illustrated in FIG. 1, in the light transmitting apparatus, a thermoelectric cooler (TEC) 13 serving as a temperature adjustment circuit capable of adjusting the temperature of a light source 11 and an EA modulator 12 is provided in a light transmitting section 10, and a control section 20 performs temperature control of the light source 11 and the EA modulator 12 using the TEC 13, and bias voltage control of the EA modulator 12 simultaneously, in addition to the drive control of the light source 11. The configuration of the second embodiment other than the above is similar to that of the first embodiment.

Chips integrating the light source 11 and the EA modulator 12 as illustrated in FIG. 2 are mounted on the TEC 13. The TEC 13 is driven according to a temperature control signal Ct output from the control circuit 21 to control the temperature of the light source 11 and the EA modulator 12 to a required temperature.

In the light transmitting apparatus having such a configuration, the control section 20 concurrently performs; control of the wavelength and the optical output power of the light source 11 basically the same as for the case of the first embodiment, temperature control of the light source 11 and the EA modulator 12 using the TEC 13, and control of the EA bias. Regarding the temperature control and the EA bias control, there is a method for controlling both the temperature and the EA bias to be constant, a method for controlling one of the temperature and the EA bias to be constant, and variably controlling the other, and a method for variably controlling both the temperature and the EA bias.

When both the temperature and the EA bias are controlled to be constant, as in the case of the first embodiment, the reference value Ir of the EA photoelectric current corresponding to the temperature and the EA bias is stored in the memory 22 for each wavelength, and a reference value Ir corresponding to the wavelength of the light source 11 is read by the control circuit 21 from the stored information in the memory 22, and provided to the comparison circuit 23, to thereby perform feedback control of the light source 11 using the monitor value Im and the reference value Ir of the EA photoelectric current.

Figure 13:
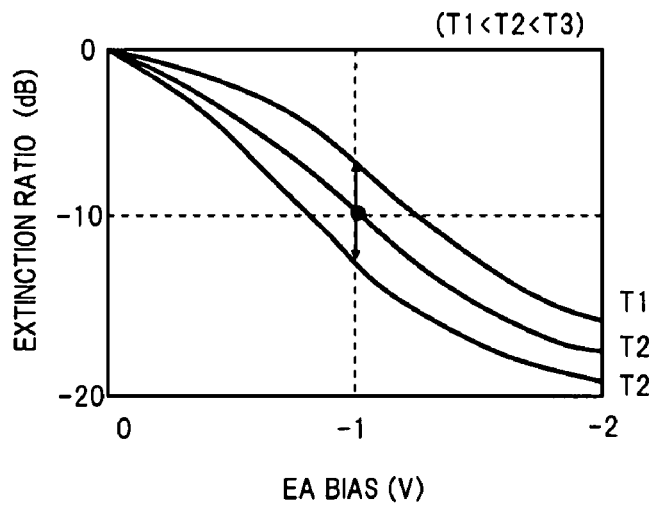
FIG. 13 illustrates temperature dependency of the extinction characteristic of the EA modulator.
Figure 14:
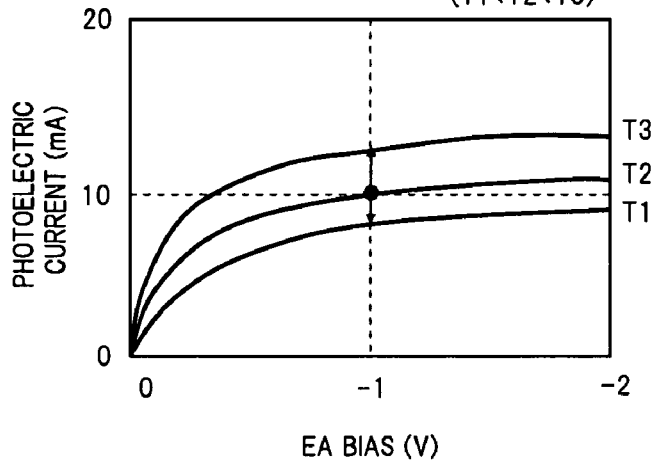
FIG. 14 illustrates temperature dependency of the photoelectric current of the EA modulator.
Figure 15:
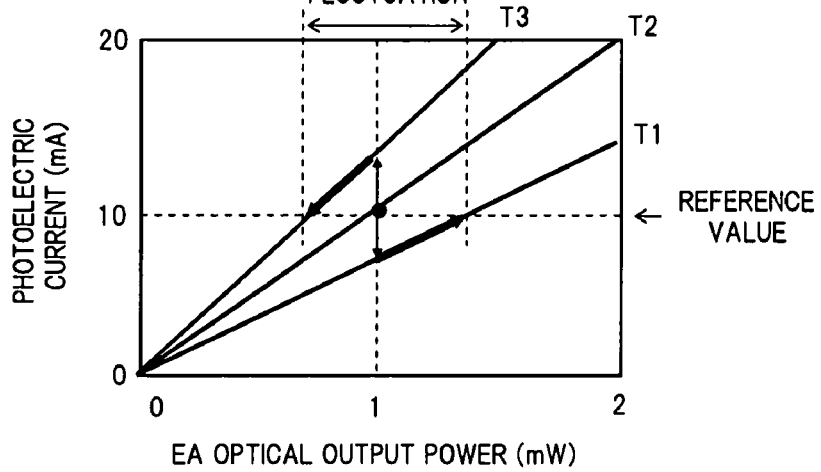
FIG. 15 illustrates optical output power fluctuation due to temperature change, in the conventional control using the EA photoelectric current.

Moreover when the temperature of the light source 11 and the EA modulator 12 is variably controlled, and the EA bias is controlled to be constant, the reference value Ir of the EA photoelectric current needs to be determined, taking into consideration not only the wavelength dependency of the EA photoelectric current (refer to FIG. 10 to FIG. 12) but also the temperature dependency of the EA photoelectric current (refer to FIG. 13 to FIG. 15). Therefore, the reference values Ir of the EA photoelectric current respectively corresponding to the combinations of the respective wavelengths within the wavelength-tunable range of the light source 11 and respective temperatures within an operation temperature range of the EA modulator are tabled based on an optical absorption property of the EA modulator as illustrated before in FIG. 4, and stored in the memory 22. As a result, in the control circuit 21, a wavelength control signal Cw for operating the light source 11 at a desired wavelength, a temperature control signal Ct for driving the TEC 13 to control the light source 11 and the EA modulator 12 to a desired temperature, and an EA bias control signal Cb for controlling the EA bias to be constant, are generated. Moreover, by reading out the reference value Ir of the EA photoelectric current corresponding to the wavelength of the light source 11 and the temperature of the EA modulator 12, from the memory 22, and providing this to the comparison circuit 23, the power of the optical signal output from the EA modulator 12 is controlled to be constant at a desired level, regardless of the wavelength and the temperature.

Figure 7:
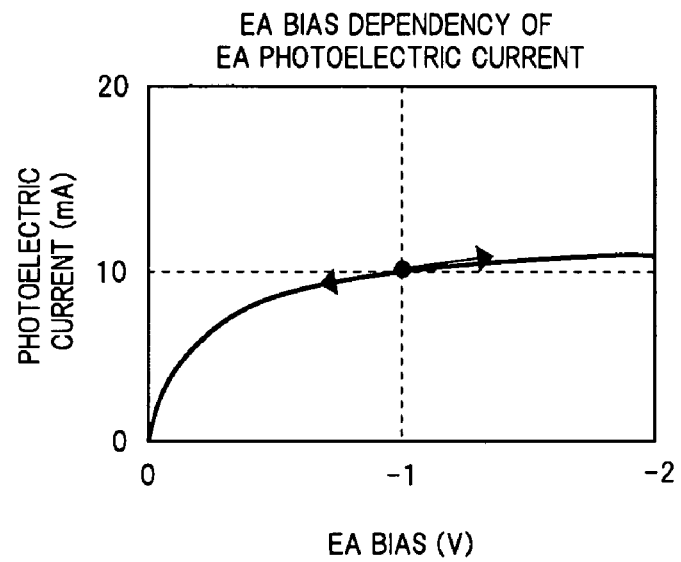
FIG. 7 illustrates bias voltage dependency of photoelectric current of the EA modulator.

Moreover, when the temperature of the light source 11 and the EA modulator 12 is controlled to be constant, and the EA bias is variably controlled, the reference value Ir of the EA photoelectric current needs to be determined, taking into consideration not only the wavelength dependency of the EA photoelectric current (refer to FIG. 10 to FIG. 12) but also the EA bias dependency of the EA photoelectric current as illustrated in FIG. 7. Therefore, the reference values Ir of the EA photoelectric current respectively corresponding to the combinations of the respective wavelengths within the wavelength-tunable range of the light source 11 and the respective levels within the variable range of the EA bias are tabled and stored in the memory 22. As a result, in the control circuit 21, the wavelength control signal Cw for operating the light source 11 at a desired wavelength, the temperature control signal Ct for controlling the temperature of the TEC 13 to be constant, and the EA bias control signal Cb for controlling the EA bias to a desired level are generated. Moreover, by reading out the reference value Ir of the EA photoelectric current corresponding to the wavelength of the light source 11 and the EA bias, from the memory 22, and providing this to the comparison circuit 23, the power of the optical signal output from the EA modulator 12 is controlled to be constant at a desired level, regardless of the wavelength and the EA bias.

Furthermore, when both the temperature and the EA bias are variably controlled, the reference value Ir of the EA photoelectric current needs to be determined, taking into consideration all of the aforementioned wavelength dependency, temperature dependency, and EA bias dependency of the EA photoelectric current. Therefore, the reference values Ir of the EA photoelectric current respectively corresponding to the combinations of; the respective wavelengths within the wavelength-tunable range of the light source 11, the respective temperatures within the operation temperature range of the EA modulator, and the respective levels within the variable range of the EA bias are tabled, and these are stored in the memory 22. As a result, in the control circuit 21, the wavelength control signal Cw for operating the light source 11 at a desired wavelength, the temperature control signal Ct for driving the TEC 13 to control the light source 11 and the EA modulator 12 to a desired temperature, and the EA bias control signal Cb for controlling the EA bias to a desired level are generated. Moreover, by reading out the reference values Ir of the EA photoelectric current corresponding to the wavelength of the light source 11, the temperature of the EA modulator 12, and the EA bias, from the memory 22, and providing these to the comparison circuit 23, the power of the optical signal output from the EA modulator 12 is controlled to be constant at a desired level, regardless of the wavelength, the temperature, and the EA bias.

As described above, according to the light transmitting apparatus in the second embodiment, even when the temperature control and the EA bias control are performed in addition to the wavelength control of the light source 11, the feedback control of the light source 11 based on the monitor value Im of the EA photoelectric current is performed, using the reference value Ir of the EA photoelectric current corresponding to the combination of the wavelength, the temperature, and the EA bias, thereby enabling to reliably suppress the optical output power fluctuations due to a change in the wavelength, the temperature, and the EA bias.

Next is a description of a third embodiment of the invention.

Figure 8:
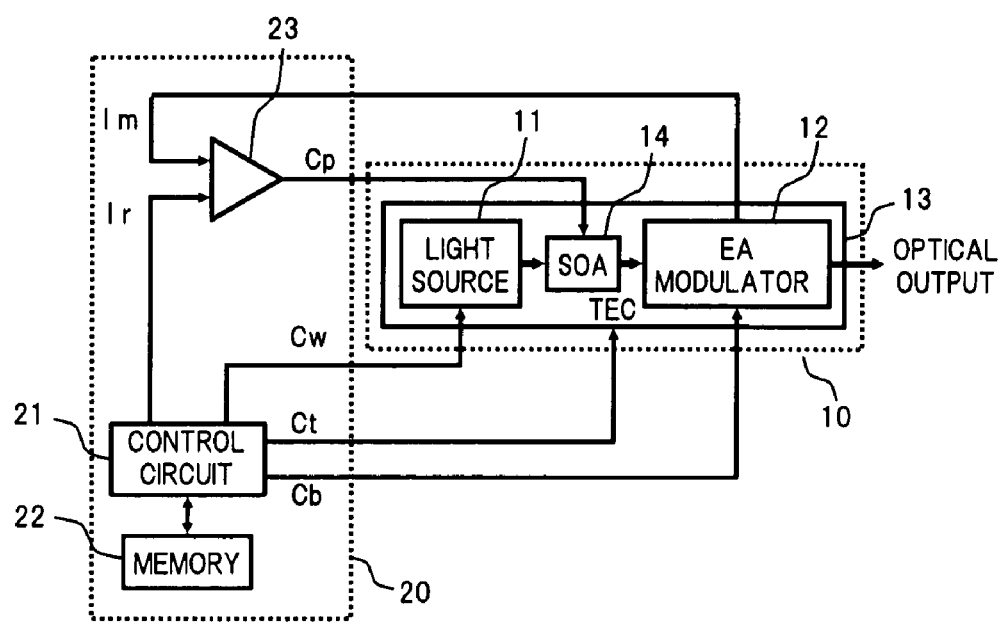
FIG. 8 is a block diagram illustrating a configuration of a light transmitting apparatus according to a third embodiment of the present invention.

FIG. 8 is a block diagram illustrating a configuration of a light transmitting apparatus according to the third embodiment of the invention.

In FIG. 8, for example with respect to the configuration of the second embodiment illustrated in FIG. 6, in the light transmitting apparatus, a semiconductor optical amplifier (SOA) 14 is inserted between a light source 11 and an EA modulator 12, so that the light output from the light source 11 is amplified to a desired level and provided to the EA modulator 12. Here a power control signal Cp output from a comparison circuit 23 in a control section 20 is provided to the SOA 14 to coritrol a gain of the SOA 14 according to the power control signal Cp. The configuration of the third embodiment other than the above is similar to that of the second embodiment.

Figure 9:
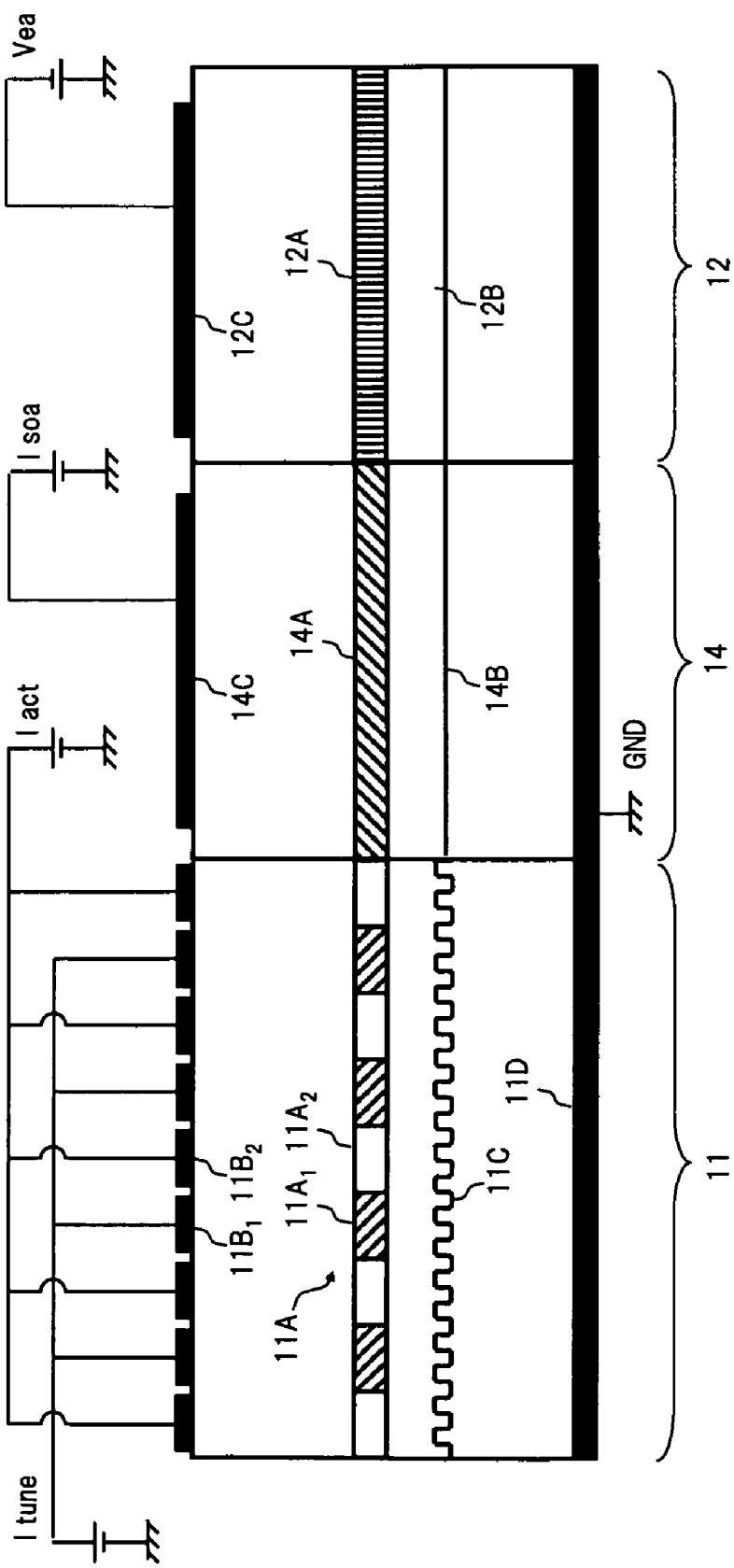
FIG. 9 is a sectional view illustrating a specific configuration example of a light source, an SOA, and the EA modulator, in the first embodiment.

For example, as illustrated in a central part in FIG. 9, the SOA 14 is integrated in the same chip as the light source 11 and the EA modulator 12. By providing the light from the light source 11 to an amplifying layer 14A surrounded by a guide layer 14B and providing a drive current Isoa to an electrode 14C, the light propagating in the amplifying layer 14A is amplified to a desired level and output. Here the gain in the SOA 14 is feed-back controlled by adjusting the drive current Isoa according to the power control signal Cp from the comparison circuit 23.

In the light transmitting apparatus having such a configuration, as in the case of the second embodiment, in the control circuit 21, a wavelength control signal Cw for operating the light source 11 at a desired wavelength, a temperature control signal Ct for driving a TEC 13 to control the light source 11 and the EA modulator 12 to a constant temperature or a desired temperature, and an EA bias control signal Cb for controlling the EA bias to a constant level or a desired level are generated, and the reference value Ir of the EA photoelectric current corresponding to the wavelength of the light source 11, the temperature of the EA modulator 12, and the EA bias is read from a memory 22 and provided to the comparison circuit 23. Then the monitor value Im and the reference value Ir of the EA photoelectric current are compared in the comparison circuit 23, and the power control signal Cp corresponding to the difference thereof is here output to the SOA 14 to adjust the drive current Isoa of the SOA 14 according to the power control signal Cp. As a result, the power of the optical signal output from the EA modulator 12 is controlled to be constant at a desired level, regardless of the wavelength, the temperature, and the EA bias.

In the above manner, according to the light transmitting apparatus in the third embodiment, the same effects as for the case of the second embodiment can be obtained, and by providing the SOA 14 between the light source 11 and the EA modulator 12, the optical signal output from a light transmitting section 10 can be controlled to be constant at a higher level.

In the third embodiment, a configuration example for controlling the drive current Isoa of the SOA 14 according to the power control signal Cp from the comparison circuit 23 is represented. However, the drive current Iact of the light source 11 can be controlled according to the power controls signal Cp, to make the drive current Isoa of the SOA 14 constant.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A light transmitting apparatus comprising;
  a light transmitter having a light source and an electro-absorption optical modulator that modulates light output from the light source, and
  a controller that controls the light transmitter so that an optical output power from the light transmitter becomes constant, based on a monitor value of photoelectric current generated due to light absorption by the electro-absorption optical modulator, and the photoelectric current is outputted directly from the electro-absorption optical modulator, wherein
  the controller is configured to use a reference value of the photoelectric current corresponding to a wavelength of the light source, from amongst reference values of the photoelectric current that are different for each wavelength and are set depending on the wavelength dependency of the photoelectric current of the electro-absorption optical modulator, to control the light transmitter depending on a difference between the reference value and the monitor value.

2. A light transmitting apparatus according to claim 1, wherein
the light source wavelength and optical output power are variable, and
the controller has;
a memory configured to store information related to reference values of the photoelectric current that are different for each wavelength,
a control circuit configured to variable control the wavelength of the light source, and to read out a reference value of the photoelectric current corresponding to the wavelength of the light source from the stored information of the memory, and
a comparator circuit configured to compare the monitor value of the photoelectric current with the reference value that is read out by the control circuit, and to control the optical output power of the light source so as to reduce a difference therebetween.

3. A light transmitting apparatus according to claim 2, wherein
the light source is configured to use a wavelength variable light source that has;
an optical waveguide that has a wavelength control layer capable of controlling an oscillation wavelength, and a gain control layer capable of controlling gain, arranged alternately in an optical axis direction, a diffraction grating formed along the optical waveguide, and a drive control circuit capable of independently controlling a first drive current applied to an electrode corresponding to the wavelength control layer and a second drive current provided to an electrode corresponding to the gain control layer.

4. A light transmitting apparatus according to claim 2, wherein
the light transmitter has a temperature adjustment circuit capable of adjusting a temperature of at least the electro-absorption optical modulator, and
the control circuit is configured to control thea temperature of the temperature adjustment circuit and a bias voltage of the electro-absorption optical modulator.

5. A light transmitting apparatus according to claim 4, wherein
the control circuit is configured to control the temperature of the temperature adjustment circuit to be constant, and to control the bias voltage of the electro-absorption optical modulator to be constant.

6. A light transmitting apparatus according to claim 4, wherein
the memory is configured to store information that is set corresponding to wavelength dependence and temperature dependence of the photoelectric current of the electro-absorption optical modulator, and that is related to the reference values of the photoelectric current that are different for each combination of the wavelength and the temperature, and
the control circuit is configured to variable control the temperature of the temperature adjustment circuit and to control the bias voltage of the electro-absorption optical modulator to be constant, and to read out the reference value of the photoelectric current corresponding to the wavelength of the light source and the temperature of the electro-absorption optical modulator from the stored information of the memory.

7. A light transmitting apparatus according to claim 4, wherein
the memory is configured to store information that is set corresponding to wavelength dependence and bias voltage dependence of the photoelectric current of the electro-absorption optical modulator, and that is related to the reference values of the photoelectric current that are different for each combination of the wavelength and the bias voltage, and
the control circuit is configured to control the temperature of the temperature adjustment circuit to be constant, and to variable control the bias voltage of the electro-absorption optical modulator, and to read out the reference value of the photoelectric current corresponding to the wavelength of the light source and the bias voltage of the electro-absorption optical modulator from the stored information of the memory.

8. A light transmitting apparatus according to claim 4, wherein
the memory is configured to store information that is set corresponding to wavelength dependence, temperature dependence, and bias voltage dependence of the photoelectric current of the electro-absorption optical modulator, and that is related to the reference values of the photoelectric current that are different for each combination of the wavelength, the temperature, and the bias voltage, and
the control circuit is configured to variable control the temperature of the temperature adjustment circuit, and to variable control the bias voltage of the electro-absorption optical modulator, and to read out the reference value of the photoelectric current corresponding to the wavelength of the light source, the temperature of the electro-absorption optical modulator, and the bias voltage of the electro-absorption optical modulator from the stored information of the memory.

9. A light transmitting apparatus according to claim 4, wherein
the light transmitter has an optical amplifier that amplifies light output from the light source and provides the amplified light to the electro-absorption optical modulator, and
the comparator circuit is configured to control either one of the optical output power of the light source and a gain of the optical amplifier so as to reduce the difference between the monitor value of the photoelectric current and the reference value.

10. A light transmitting apparatus according to claim 9, wherein the optical amplifier is a semiconductor optical amplifier that is integrated in a same chip as the light source and the electro-absorption optical modulator.

11. A method for controlling a light transmitting apparatus, comprising:
outputting light from a light source to an electro-absorption optical modulator to modulate the light;
monitoring photoelectric current generated due to light absorption by the electro-absorption optical modulator and outputted directly from the electro-absorption optical modulator, and controlling the light transmitting apparatus based on a monitor value of the photoelectric current so that an optical output power of the light transmitting apparatus becomes constant;
setting reference values of photoelectric current that are different for each wavelength depending on wavelength dependency of the photoelectric current of the electro-absorption optical modulator; and
using a reference value of the photoelectric current corresponding to the wavelength of the light source, from amongst the set reference values of the photoelectric current that are different for each wavelength, to control the light transmitting apparatus depending on a difference between the reference value and the monitor value.

12. A light transmitting apparatus comprising;
a light transmitting section having a light source and an electro-absorption optical modulator that modulates light output from the light source; and
a control section that controls the light transmitting section so that an optical output power from the light transmitting section becomes constant, based on a monitor value of photoelectric current generated due to light absorption by the electro-absorption optical modulator,
wherein the control section is configured to use a reference value of the photoelectric current corresponding to a wavelength of the light source, from amongst reference values of the photoelectric current that are different for each wavelength and are set depending on the wavelength dependency of the photoelectric current of the electro-absorption optical modulator, to control the light transmitting section depending on a difference between the reference value and the monitor value,
wherein the light transmitting section has a light source in which the wavelength and optical output power are variable, and
the control section has—
a memory configured to store information related to reference values of the photoelectric current that are different for each wavelength,
a control circuit configured to variable control the wavelength of the light source, and to read out a reference value of the photoelectric current corresponding to the wavelength of the light source from the stored information of the memory, and
a comparator circuit configured to compare the monitor value of the photoelectric current with the reference value that is read out by the control circuit, and to control the optical output power of the light source so as to reduce a difference therebetween, and
wherein the light source is configured to use a wavelength variable light source that has an optical waveguide that has a wavelength control layer capable of controlling an oscillation wavelength, and a gain control layer capable of controlling gain, arranged alternately in an optical axis direction, a diffraction grating formed along the optical waveguide, and a drive control circuit capable of independently controlling a first drive current applied to an electrode corresponding to the wavelength control layer and a second drive current provided to an electrode corresponding to the gain control layer.

13. A light transmitting apparatus comprising;
a light transmitting section having a light source and an electro-absorption optical modulator that modulates light output from the light source; and
a control section that controls the light transmitting section so that an optical output power from the light transmitting section becomes constant, based on a monitor value of photoelectric current generated due to light absorption by the electro-absorption optical modulator,
wherein the control section is configured to use a reference value of the photoelectric current corresponding to a wavelength of the light source, from amongst reference values of the photoelectric current that are different for each wavelength and are set depending on the wavelength dependency of the photoelectric current of the electro-absorption optical modulator, to control the light transmitting section depending on a difference between the reference value and the monitor value,
wherein the light transmitting section has a light source in which the wavelength and optical output power are variable, and
the control section has—
a memory configured to store information related to reference values of the photoelectric current that are different for each wavelength,
a control circuit configured to variable control the wavelength of the light source, and to read out a reference value of the photoelectric current corresponding to the wavelength of the light source from the stored information of the memory, and
a comparator circuit configured to compare the monitor value of the photoelectric current with the reference value that is read out by the control circuit, and to control the optical output power of the light source so as to reduce a difference therebetween, and
wherein the light transmitting section has a temperature adjustment circuit capable of adjusting a temperature of at least the electro-absorption optical modulator, and
the control circuit is configured to control a temperature of the temperature adjustment circuit and a bias voltage of the electro-absorption optical modulator.

14. A light transmitting apparatus according to claim 13, wherein
the control circuit is configured to control the temperature of the temperature adjustment circuit to be constant, and to control the bias voltage of the electro-absorption optical modulator to be constant.

15. A light transmitting apparatus according to claim 13, wherein
the memory is configured to store information that is set corresponding to wavelength dependence and temperature dependence of the photoelectric current of the electro-absorption optical modulator, and that is related to the reference values of the photoelectric current that are different for each combination of the wavelength and the temperature, and
the control circuit is configured to variable control the temperature of the temperature adjustment circuit and to control the bias voltage of the electro-absorption optical modulator to be constant, and to read out the reference value of the photoelectric current corresponding to the wavelength of the light source and the temperature of the electro-absorption optical modulator from the stored information of the memory.

16. A light transmitting apparatus according to claim 13, wherein
the memory is configured to store information that is set corresponding to wavelength dependence and bias voltage dependence of the photoelectric current of the electro-absorption optical modulator, and that is related to the reference values of the photoelectric current that are different for each combination of the wavelength and the bias voltage, and
the control circuit is configured to control the temperature of the temperature adjustment circuit to be constant, and to variable control the bias voltage of the electro-absorption optical modulator, and to read out the reference value of the photoelectric current corresponding to the wavelength of the light source and the bias voltage of the electro-absorption optical modulator from the stored information of the memory.

17. A light transmitting apparatus according to claim 13, wherein
the memory is configured to store information that is set corresponding to wavelength dependence, temperature dependence, and bias voltage dependence of the photoelectric current of the electro-absorption optical modulator, and that is related to the reference values of the photoelectric current that are different for each combination of the wavelength, the temperature, and the bias voltage, and
the control circuit is configured to variable control the temperature of the temperature adjustment circuit, and to variable control the bias voltage of the electro-absorption optical modulator, and to read out the reference value of the photoelectric current corresponding to the wavelength of the light source, the temperature of the electro-absorption optical modulator, and the bias voltage of the electro-absorption optical modulator from the stored information of the memory.

18. A light transmitting apparatus according to claim 13, wherein
the light transmitting section has an optical amplifier that amplifies light output from the light source and provides the amplified light to the electro-absorption optical modulator, and
the comparator circuit is configured to control either one of the optical output power of the light source and the gain of the optical amplifier so as to reduce the difference between the monitor value of the photoelectric current and the reference value.

19. A light transmitting apparatus according to claim 18, wherein the optical amplifier is a semiconductor optical amplifier that is integrated in the same chip as the light source and the electro-absorption optical modulator.

* * * * *

UNITED STATES PATENT AND TRADEMARK OFFICE
CERTIFICATE OF CORRECTION

| | | |
|---|---|---|
| PATENT NO. | : 8,249,465 B2 | |
| APPLICATION NO. | : 12/585041 | |
| DATED | : August 21, 2012 | |
| INVENTOR(S) | : Kenichi Nakamoto | |

It is certified that error appears in the above-identified patent and that said Letters Patent is hereby corrected as shown below:

Column 11, Line 38, In Claim 4, delete "thea" and insert -- a --, therefor.

Signed and Sealed this
Thirteenth Day of November, 2012

David J. Kappos
*Director of the United States Patent and Trademark Office*